(12) United States Patent
Song et al.

(10) Patent No.: US 12,238,975 B2
(45) Date of Patent: Feb. 25, 2025

(54) DISPLAY SUBSTRATE AND DISPLAY APPARATUS

(71) Applicant: BOE Technology Group Co., Ltd., Beijing (CN)

(72) Inventors: Wenfeng Song, Beijing (CN); Changyen Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 469 days.

(21) Appl. No.: 17/763,199

(22) PCT Filed: May 14, 2021

(86) PCT No.: PCT/CN2021/093798
§ 371 (c)(1),
(2) Date: Mar. 23, 2022

(87) PCT Pub. No.: WO2021/233220
PCT Pub. Date: Nov. 25, 2021

(65) Prior Publication Data
US 2022/0367580 A1    Nov. 17, 2022

(30) Foreign Application Priority Data

May 21, 2020 (CN) .......................... 202010433987.1

(51) Int. Cl.
*H10K 59/122* (2023.01)
*H10K 50/85* (2023.01)

(52) U.S. Cl.
CPC .......... *H10K 59/122* (2023.02); *H10K 50/85* (2023.02)

(58) Field of Classification Search
None
See application file for complete search history.

(56) References Cited

U.S. PATENT DOCUMENTS

| 2005/0218452 | A1 | 10/2005 | Yamazaki et al. |
| 2020/0041837 | A1* | 2/2020 | Jiang ................. G02F 1/133609 |
| 2021/0091142 | A1 | 3/2021 | Wei et al. |
| 2021/0351243 | A1* | 11/2021 | Chang .................... H10K 50/86 |
| 2022/0271101 | A1 | 8/2022 | Bing |

FOREIGN PATENT DOCUMENTS

| CN | 104134683 A | 11/2014 |
| CN | 106653791 A | 5/2017 |
| CN | 110289298 A | 9/2019 |
| CN | 110634926 A | 12/2019 |

(Continued)

OTHER PUBLICATIONS

International Search Report for PCT/CN2021/093798 Mailed Jul. 16, 2021.

(Continued)

*Primary Examiner* — Nicholas J Tobergte
(74) *Attorney, Agent, or Firm* — Ling Wu; Stephen Yang; Ling and Yang Intellectual Property (57) ABSTRACT

A display substrate and a display apparatus are provided. The display substrate includes: a base, and a plurality of sub-pixel regions arranged in a matrix on the base. Each sub-pixel region includes a display region and a transparent region; and the boundary of the transparent region in each sub-pixel region is non-linear.

19 Claims, 5 Drawing Sheets

(56) References Cited

FOREIGN PATENT DOCUMENTS

| | | |
|---|---|---|
| CN | 110993648 A | 4/2020 |
| CN | 111564480 A | 8/2020 |
| IN | 110148621 A | 8/2019 |
| JP | 2003-332082 A | 11/2003 |

OTHER PUBLICATIONS

The First Office Action dated Jul. 22, 2021 for Chinese Patent Application No. 202010433987.1 and English Translation.
The Decision of Rejection dated Jan. 30, 2022 for Chinese Patent Application No. 202010433987.1 and English Translation.
The Notification of Reexamination dated Sep. 9, 2022 for Chinese Patent Application No. 202010433987.1 and English Translation.

* cited by examiner

DISPLAY SUBSTRATE AND DISPLAY APPARATUS

CROSS-REFERENCE TO RELATED APPLICATIONS

The present application is a U.S. National Phase Entry of International Application No. PCT/CN2021/093798 having an international filing date of May 14, 2021, which claims priority to Chinese Patent Application No. 202010433987.1 entitled "Display Substrate and Display Apparatus" and filed on May 21, 2020 to CNIPA. The entire contents of the above-identified applications are hereby incorporated by reference.

TECHNICAL FIELD

Embodiments of the present disclosure relate to, but are not limited to, the field of display technology, and more particularly, to a display substrate and a display device.

BACKGROUND

With the development of display technology, various new display technologies are constantly emerging. Transparent display technology among them is getting more and more attention. A transparent display device refers to a display device that can form a transparent display state so that viewers can see a display image of the display device and a scene behind the display device.

SUMMARY

The following is a summary about the subject matter set forth in the present disclosure. The summary is not intended to limit the protection scope of the claims.

In a first aspect, the present disclosure provides a display substrate, which includes a base and a plurality of sub-pixel regions arranged in a matrix on the base, each of the sub-pixel regions including a display region and a transparent region; and the transparent region of each of the sub-pixel regions including at least one arc boundary.

In some possible implementations, each sub-pixel region is an axisymmetric structure, and symmetry axes of each sub-pixel region include a first symmetry axis and a second symmetry axis; a first direction is an extension direction of the first symmetry axis, and a second direction is an extension direction of the second symmetry axis; the first direction is perpendicular to the second direction; a plane formed by the first direction and the second direction is parallel to a plane where the display substrate is located; each sub-pixel region is evenly divided into a first region, a second region, a third region and a fourth region; and the first region and the second region are arranged along the first direction; the third region and the fourth region are arranged along the second direction; the first region and the third region are arranged along the second direction, and the second region and the fourth region are arranged along the second direction.

In some possible implementations, the plurality of sub-pixel regions includes a first type of sub-pixel regions or a second type of sub-pixel regions; the boundary of the transparent region of the first type of sub-pixel region is in the shape of a circle; and the transparent region of the second type of sub-pixel region includes a first transparent region, a second transparent region, a third transparent region and a fourth transparent region which are spaced apart from each other; boundaries of the first transparent region, the second transparent region, the third transparent region and the fourth transparent region are in the shape of a right-angle sector.

In some possible implementations, the plurality of sub-pixel regions includes a first type of sub-pixel regions and a second type of sub-pixel regions; the boundary of the transparent region of the first type of sub-pixel region is in the shape of a circle; the transparent region of the second type of sub-pixel region includes a first transparent region, a second transparent region, a third transparent region and a fourth transparent region which are spaced apart from each other; boundaries of the first transparent region, the second transparent region, the third transparent region and the fourth transparent region are in the shape of a right-angle sector.

In some possible implementations, for at least part of the transparent regions, a first interval, which is an interval between a transparent region and a first adjacent transparent region along the first direction, is equal to a second interval, which is an interval between the transparent region and a second adjacent transparent region along the second direction, wherein the first adjacent transparent region and the transparent region are arranged along the first direction, and the second adjacent transparent region and the transparent region are arranged along the second direction.

In some possible implementations, a center of the transparent region in the first type of sub-pixel region coincides with a center of the first type of sub-pixel region, and the center of the first type of sub-pixel region is an intersection point of the first symmetry axis and the second symmetry axis.

In some possible implementations, a diameter of the transparent region in the first type of sub-pixel region is smaller than a length of the first type of sub-pixel region along the first direction and smaller than a length of the first type of sub-pixel region along the second direction; and the display region in the first type of sub-pixel region surrounds the transparent region in the first type of sub-pixel region.

In some possible implementations, for the second type of sub-pixel region, the first transparent region is located in the first region, the second transparent region is located in the second region, the third transparent region is located in the third region, and the fourth transparent region is located in the fourth region; and the first transparent region and the second transparent region are mirror symmetric with respect to the second symmetry axis, the third transparent region and the fourth transparent region are mirror symmetric with respect to the second symmetry axis, the first transparent region and the third transparent region are mirror symmetric with respect to the first symmetry axis, and the second transparent region and the fourth transparent region are mirror symmetric with respect to the first symmetry axis.

In some possible implementations, the right-angle sector includes an arc; and the arc is tangent to a boundary of the second type of sub-pixel region.

In some possible implementations, the right-angle sector includes a third symmetry axis; and the third symmetry axis intersects with the first symmetry axis and the second symmetry axis respectively.

In some possible implementations, when the plurality of sub-pixel regions includes the first type of sub-pixel regions and the second type of sub-pixel regions, the types of the sub-pixel regions in a same column are the same, but the types of the sub-pixel regions in a same row are different; and for the sub-pixel regions in the same row, two sub-pixel regions of the second type are arranged between adjacent sub-pixel regions of the first type; one sub-pixel region of the first type is arranged between adjacent sub-pixel regions of the second type.

In some possible implementations, the display region includes a driving structure layer and a light emitting structure layer which are sequentially disposed on the base; and the driving structure layer is connected to the light emitting structure layer and is configured to drive the light emitting structure layer to emit light.

In some possible implementations, the light emitting structure layer includes a first electrode, an organic light emitting layer and a second electrode; the first electrode is arranged on one side of the organic light emitting layer close to the base, and the second electrode is arranged on one side of the organic light emitting layer away from the base; the first electrode is a reflective electrode, and the second electrode is a transmissive electrode and is a planar electrode; and an orthographic projection of the second electrode on the base coincides with an orthographic projection of the transparent region on the base.

In a second aspect, the present disclosure further provides a display device including the display substrate described above.

After the drawings and the detailed description are read and understood, the other aspects may become clear.

BRIEF DESCRIPTION OF DRAWINGS

The drawings are intended to provide an understanding of technical solutions of the present disclosure and form a part of the specification, and are used to explain the technical solutions of the present disclosure together with the embodiments of the present disclosure, and do not form limitations to the technical solutions of the present disclosure.

DETAILED DESCRIPTION

Multiple embodiments are described in the present disclosure, but the description is exemplary rather than restrictive. For those of ordinary skill in the art, there may be more embodiments and implementations within the scope contained by the embodiments described in the present disclosure. Although many possible combinations of features are shown in the accompanying drawings and discussed in the detailed description, many other combinations of the disclosed features are also possible. Unless specifically limited, any feature or element of any embodiment may be used in combination with any other feature or element in any other embodiment, or may substitute any other feature or element in any other embodiment.

Combinations of the features and elements known to those of ordinary skill in the art are included and conceived in the present disclosure. The embodiments, features and elements that have been disclosed in the present disclosure can also be combined with any of conventional features or elements to form the technical solutions defined by the claims. Any feature or element of any embodiment may also be combined with features or elements from other technical solutions to form another technical solution defined by the claims. Therefore, any of the features presented in the present disclosure may be implemented separately or in any suitable combination. Therefore, the embodiments are not subject to other limitations except limitations according to the appended claims and equivalent substitutions thereof. Furthermore, various modifications and alterations may be made within the protection scope of the appended claims.

Unless otherwise defined, technical terms or scientific terms used in the present disclosure shall have ordinary meanings understood by those of ordinary skills in the art to which the present disclosure pertains. "First", "second" and the like used in the present disclosure do not indicate any order, quantity, or importance, but are intended to distinguish different components only. "Include" or "contain" or the like means that an element or article appearing before this word covers elements or articles listed after this word and their equivalents, and does not exclude other elements or articles. "Connected" or "coupled" or the like is not limited to a physical or mechanical connection, but may include an electrical connection, whether direct or indirect. "Upper", "lower", "left", "right", etc., are only used to indicate a relative positional relationship, which may be changed accordingly when an absolute position of a described object is changed.

A transparent display device includes transparent regions and opaque regions. An image of the transparent display device may have ghosting. A main reason is that distant scenery is composed of point light sources, and light emitted by each of the point light sources is coherent light when reaching the transparent display device, while the transparent regions and the opaque regions in the transparent display panel are periodically distributed along the same direction, and the periodically arranged transparent regions and opaque regions form a grating-like structure. Therefore, diffraction will occur in the transmitted light along the arrangement direction of the transparent regions and the opaque regions, such that ghosting occurs in the display image, resulting in blurring of the image and decreasing the display effect of the transparent display device.

Figure 1:
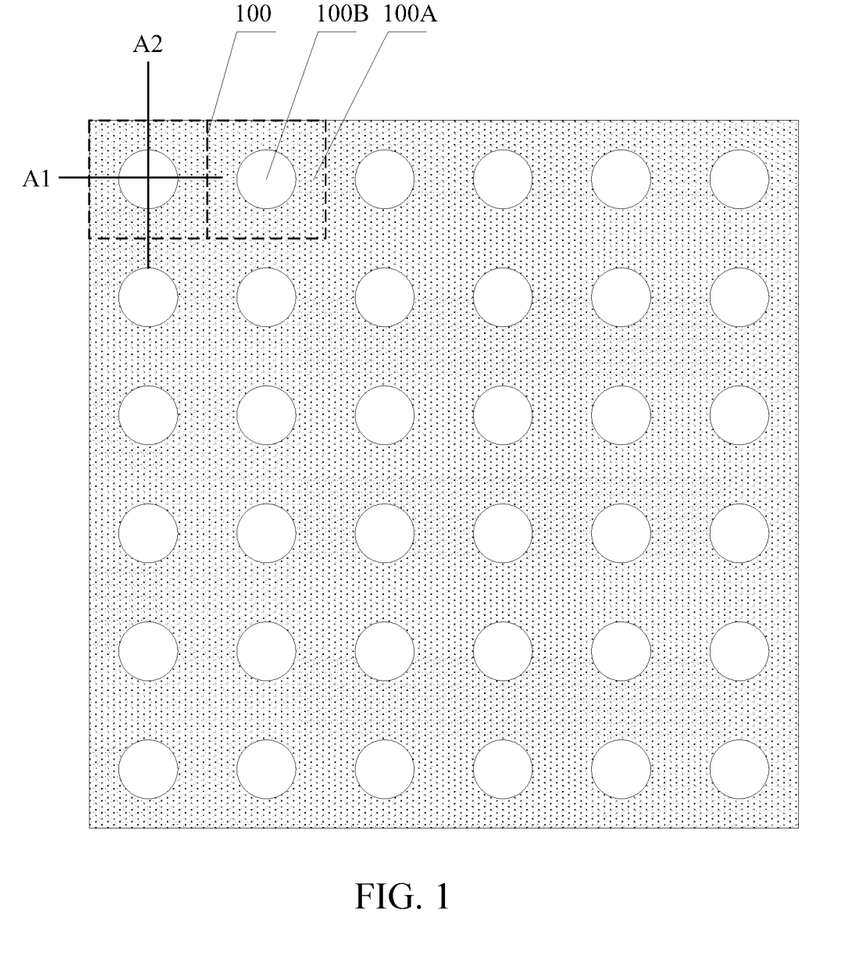
FIG. 1 is a schematic top view of a display substrate in accordance with an embodiment of the present disclosure.
Figure 2:
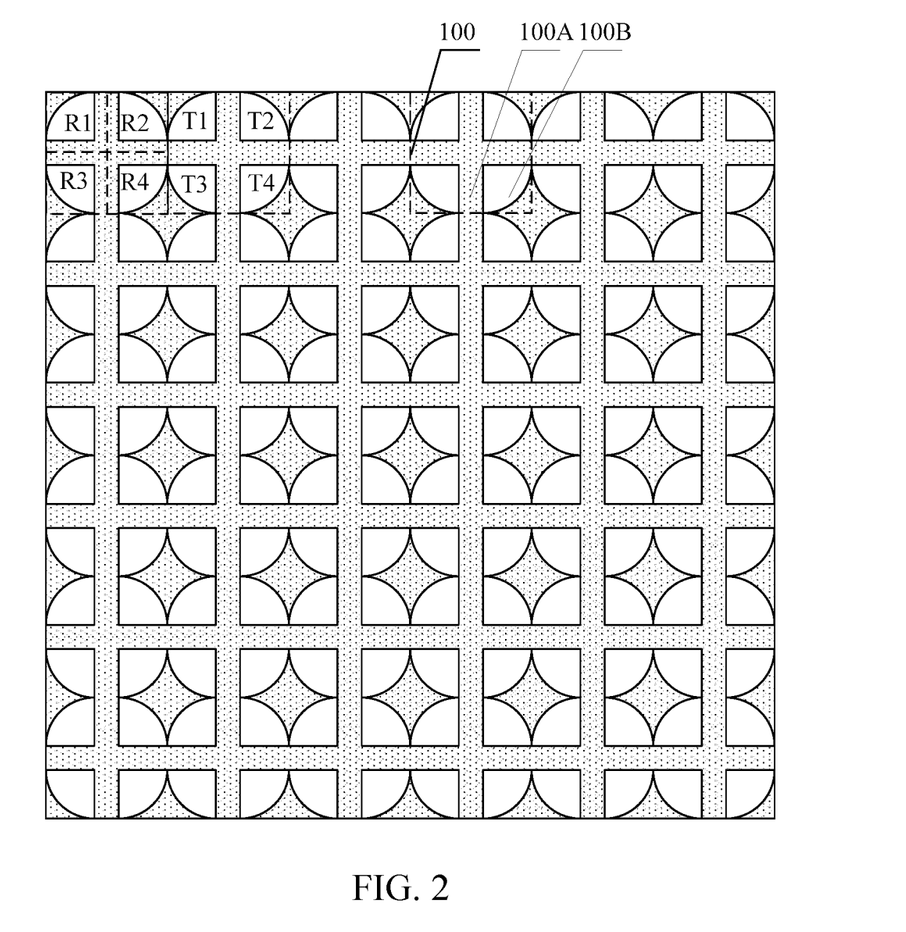
FIG. 2 is a schematic top view of another display substrate in accordance with an embodiment of the present disclosure.
Figure 3:
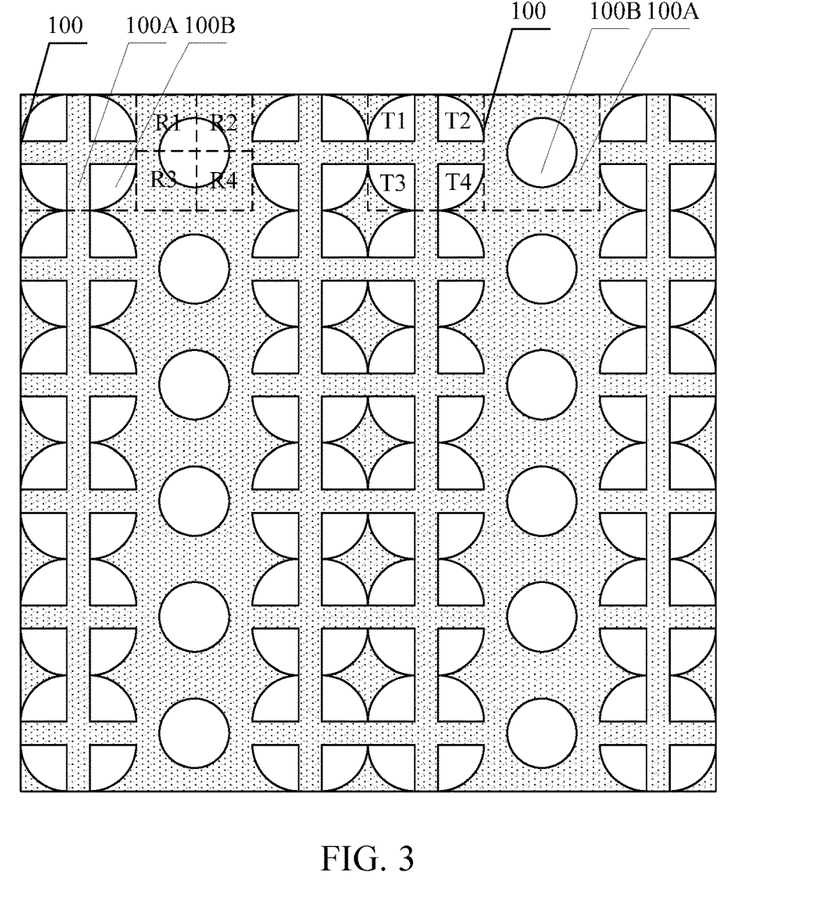
FIG. 3 is a schematic top view of still another display substrate in accordance with an embodiment of the present disclosure.
Figure 4:
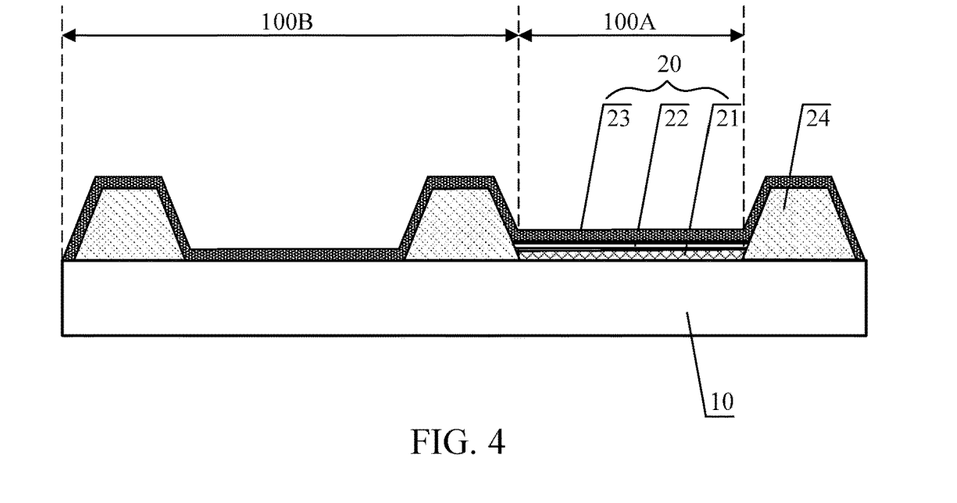
FIG. 4 is a sectional view of a display substrate in accordance with an embodiment of the present disclosure.

FIG. 1 is a schematic top view of a display substrate in accordance with an embodiment of the present disclosure, FIG. 2 is a schematic top view of another display substrate in accordance with an embodiment of the present disclosure, FIG. 3 is a schematic top view of still another display substrate in accordance with an embodiment of the present disclosure, and FIG. 4 is a sectional view of a display substrate in accordance with an embodiment of the present disclosure. As shown in FIGS. 1 to 4, the display substrate in accordance with the embodiment of the present disclosure may include: a base 10 and a plurality of sub-pixel regions arranged in a matrix on the base 10. Each sub-pixel region includes a display region 100A and a transparent region 100B, and the transparent region 100B in each sub-pixel region includes at least one arc boundary.

In an exemplary embodiment, the display region refers to a region in which there are a pixel unit for displaying an image and a pixel driving circuit, and background light at the back of the display substrate cannot be transmitted or the transmittance of the background light is low. The transparent region refers to a region in which there is no pixel unit for displaying an image or pixel driving circuit and the background light of at the back of the display substrate can be transmitted or the transmittance of the background light is high.

In an exemplary embodiment, the display substrate can be an organic light emitting diode transparent display substrate, a liquid crystal transparent display substrate or a transflective transparent display substrate, which is not limited in the embodiments of the present disclosure.

In an exemplary embodiment, the base 10 may be a rigid base or a flexible base. The rigid base may be made of, but not limited to, one or more of glass and metal foil. The flexible base may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the plurality of sub-pixel regions can be arranged in the shape of a stripe, or can be arranged in a shape like the Chinese character "品", or arranged in other shapes, which is not limited in the embodiments of the present disclosure.

In an exemplary embodiment, areas of adjacent sub-pixel regions may be equal or unequal, which is not limited in the embodiment of the present disclosure.

In an exemplary embodiment, areas of the transparent regions in adjacent sub-pixel regions may be equal or unequal, which is not limited in the embodiments of the present disclosure.

In an exemplary embodiment, distances between the transparent regions in adjacent sub-pixel regions may be equal or unequal, which is not limited in the embodiments of the present disclosure.

It can be known from the definition of grating that an optical device composed of a large number of parallel slits with equal width arranged at equal intervals is called grating. When the boundary of the transparent region in each sub-pixel region is non-linear, the slits among a plurality of display regions arranged along a single direction do not have equal width and are not arranged at equal intervals, thus cannot form the grating, such that diffraction of light in the single direction can be reduced and the diffraction can be evenly scattered in various directions, thereby reducing ghosting in the image in the single direction.

The display substrate in accordance with the embodiment of the present disclosure includes a base and a plurality of sub-pixel regions arranged in a matrix on the base, each of the sub-pixel regions including a display region and a transparent region, and the transparent region of each of the sub-pixel regions including at least one arc boundary. In the present disclosure, the diffraction of light in a single direction can be reduced by configuring the transparent region in each sub-pixel region to include at least one arc boundary, such that ghosting in the image can be reduced, thereby improving the clarity of the display image and improving the display effect of the display substrate.

In an exemplary embodiment, as shown in FIGS. 1 to 3, each sub-pixel region 100 may be of an axisymmetric structure. Symmetry axes of each sub-pixel region may include a first symmetry axis and a second symmetry axis.

In an exemplary embodiment, the first symmetry axes of all sub-pixel regions are parallel to each other, and the second symmetry axes of all sub-pixel regions are parallel to each other.

Taking the first sub-pixel region as an example, as shown in FIG. 1, symmetry axes of the first sub-pixel region includes a first symmetry axis A1 and a second symmetry axis A2.

In an exemplary embodiment, a first direction is an extension direction of the first symmetry axis and a second direction is an extension direction of the second symmetry axis. The first direction is perpendicular to the second direction, and a plane formed by the first direction and the second direction is parallel to a plane where the transparent display panel is located.

In an exemplary embodiment, the sub-pixel region may be in the shape of a rectangle, a square, an approximate square, a parallelogram or a trapezoid. In FIGS. 1 to 3, the sub-pixel region is illustrated in the shape of a square as an example.

In an exemplary embodiment, as shown in FIGS. 2 and 3, each sub-pixel region can be evenly divided into a first region R1, a second region R2, a third region R3 and a fourth region R4. The first region R1 and the second region R2 are arranged along the first direction, the third region R3 and the fourth region R4 are arranged along the second direction, the first region R1 and the third region R3 are arranged along the second direction, and the second region R2 and the fourth region R4 are arranged along the second direction.

In an exemplary embodiment, the plurality of sub-pixel regions may include a first type of sub-pixel regions and/or a second type of sub-pixel regions. In FIG. 1, each sub-pixel region illustrated is the first type of sub-pixel region as an example. In FIG. 2, each sub-pixel region illustrated is the second type of sub-pixel region as an example. In FIG. 3, the plurality of sub-pixel regions illustrated includes the first type of sub-pixel regions and the second type of sub-pixel regions as an example.

In an exemplary embodiment, as shown in FIG. 1, the boundary of the transparent region of the first type of sub-pixel region may be in the shape of a circle.

In an exemplary embodiment, as shown in FIG. 1, for at least part of the transparent regions, a first interval is approximately equal to a second interval. The first interval is an interval between a transparent region and a first adjacent transparent region along the first direction, the second interval is an interval between the transparent region and a second adjacent transparent region along the second direction. The first adjacent transparent region and the transparent region are arranged along the first direction, and the second adjacent transparent region and the transparent region are arranged along the second direction. For at least part of the transparent regions, the first interval is approximately equal to the second interval, such that the strong diffraction in a single direction can be reduced, thereby improving the display effect of the display substrate.

In an exemplary embodiment, a center of the transparent region in the first type of sub-pixel region may coincide with a center of the first type of sub-pixel region. The center of the first type of sub-pixel region is an intersection point of the first symmetry axis and the second symmetry axis.

In an exemplary embodiment, as shown in FIGS. 1 and 3, a diameter D of the transparent region in the first type of sub-pixel region may be smaller than a length L1 of the first type of sub-pixel region along the first direction and smaller than a length L2 of the first type of sub-pixel region along the second direction. The display region 100A in the first type of sub-pixel region surrounds the transparent region 100B in the first type of sub-pixel region.

In an exemplary embodiment, as shown in FIGS. 2 and 3, the transparent region of the second type of sub-pixel region includes a first transparent region T1, a second transparent region T2, a third transparent region T3 and a fourth transparent region T4 which are spaced apart from each other. Boundaries of the first transparent region T1, the second transparent region T2, the third transparent region T3 and the fourth transparent region T4 are in the shape of a right-angle sector.

In an exemplary embodiment, as shown in FIGS. 2 and 3, for each of the second type of sub-pixel regions, the first transparent region T1 is located in the first region R1, the second transparent region T2 is located in the second region R2, the third transparent region T3 is located in the third region R3, and the fourth transparent region T4 is located in the fourth region R4.

The first transparent region T1 and the second transparent region T2 are mirror symmetric with respect to the second symmetry axis, the third transparent region T3 and the fourth transparent region T4 are mirror symmetric with respect to the second symmetry axis, the first transparent region T1 and the third transparent region T3 are mirror symmetric with respect to the first symmetry axis, and the second transparent region T2 and the fourth transparent region T4 are mirror symmetric with respect to the first symmetry axis.

In an exemplary embodiment, as shown in FIGS. 2 and 3, the right-angle sector includes an arc. The arc is tangent to a boundary of the second type of sub-pixel region.

In an exemplary embodiment, the right-angle sector includes a third symmetry axis. The third symmetry axis intersects with the first symmetry axis and the second symmetry axis respectively. The third symmetry axis is a symmetry axis of the arc.

In an exemplary embodiment, as shown in FIG. 3, when the plurality of sub-pixel regions includes the first type of sub-pixel regions and the second type of sub-pixel regions, the types of the sub-pixel regions in a same column are the same, but the types of the sub-pixel regions in a same row are different.

For the same row of sub-pixel regions, two sub-pixel regions of the second type are arranged between adjacent sub-pixel regions of the first type; one sub-pixel region of the first type is arranged between adjacent sub-pixel regions of the second type.

In an exemplary embodiment, as shown in FIG. 4, the display region 100A may include a driving structure layer (not shown in the figure) and a light emitting structure layer 20 which are sequentially arranged on the base. The driving structure layer is connected to the light emitting structure layer and is configured to drive the light emitting structure layer to emit light.

In an exemplary embodiment, the driving structure layer may include thin film transistors, a passivation layer and a planarization layer, which are sequentially arranged along a direction perpendicular to the base. A plurality of thin film transistors can constitute a pixel driving circuit. Drain electrodes of the thin film transistors are electrically connected to the light emitting structure layer through via holes in the passivation layer and the planarization layer.

In an exemplary embodiment, a thin film transistor may include an active layer, a gate electrode, and a source-drain electrode. The thin film transistor may be of a bottom gate structure or a top gate structure, which is not limited in the embodiments of the present disclosure.

In an exemplary embodiment, the planarization layer can ensure that the light emitted by the light emitting structure layer is uniform.

In an exemplary embodiment, the thin film transistor may be a monocrystalline silicon thin film transistor, a low-temperature polycrystalline silicon thin film transistor or an oxide thin film transistor. Generally, in order to satisfy a driving current of the thin film transistor, a channel ratio (a ratio of a width of a channel layer to a length of the channel layer) of the monocrystalline silicon thin film transistor is greater than 6, a channel ratio of the oxide thin film transistor is greater than 2, and a channel ratio of the low-temperature polycrystalline silicon thin film transistor is greater than 0.5. In order to reduce the size of the thin film transistor, the low-temperature polycrystalline silicon thin film transistor is adopted, so that the thin film transistor can be made smaller in size, and a proportion of the display region to the pixel region is smaller, which is conducive to improving the transparent display effect of the display substrate. In addition, when the thin film transistor is made smaller, the sub-pixel region can also be made smaller, which is also conducive to improving the resolution of the display substrate.

In an exemplary embodiment, the light emitting structure layer includes a plurality of light emitting elements. One electrode of a light emitting element is connected to the pixel driving circuit.

In an exemplary embodiment, the light emitting element may be an Organic Light Emitting Diode (OLED).

In an exemplary embodiment, as shown in FIG. 4, the light emitting structure layer may include a first electrode 21, an organic light emitting layer 22 and a second electrode 23. The first electrode 21 is located on one side of the organic light emitting layer 22 close to the base 10, and the second electrode 23 is located on one side of the organic light emitting layer 22 away from the base 10.

In an exemplary embodiment, the first electrode may be a reflective electrode. The reflective electrode may be made of a material including copper or aluminum.

In an exemplary embodiment, the organic light emitting layer may include a light emitting material layer and may also include at least one of an electron transport layer, an electron injection layer, a hole transport layer and a hole injection layer.

In an exemplary embodiment, the second electrode may be a transmissive electrode and be a planar electrode. The transmissive electrode may be made of a transparent conductive material, such as indium tin oxide or zinc tin oxide.

In an exemplary embodiment, as shown in FIG. 4, an orthographic projection of the second electrode 23 on the base 10 may coincide with an orthographic projection of the transparent region 100B on the base 10.

In an exemplary embodiment, as shown in FIG. 4, the display substrate may further include a pixel definition layer 24.

In an exemplary embodiment, the pixel definition layer may be made of an inorganic transparent material or an organic transparent material. Whether it is made of the inorganic transparent material or the organic transparent material does not affect the transmittance of the transparent region. The inorganic transparent material may be silicon dioxide or silicon nitride, and the organic transparent material may be polyimide.

In an exemplary embodiment, the display substrate may further include an encapsulation layer disposed on one side of the second electrode away from the base. The encapsulation layer can isolate the light emitting structure layer from the outside, to prevent water and oxygen from entering the organic light emitting layer, thereby prolonging the service life of the display substrate. In addition, as a surface of the encapsulation layer is flat, other film layers which are beneficial to the display effect of the transparent display substrate can be disposed on the display substrate.

In an exemplary embodiment, the transparent region may include a transparent material layer configured to achieve light transmission.

The relative intensity of secondary diffraction peaks along the first direction when light of the display substrate provided in FIG. 1 is diffracted is greater than that of secondary diffraction peaks along the first direction when light of the display substrate provided in FIG. 2 is diffracted, and the relative intensity of the secondary diffraction peaks along the first direction when the light of the display substrate provided in FIG. 2 is diffracted is greater than that of secondary diffraction peaks along the first direction when light of the display substrate provided in FIG. 3 is diffracted. When the light of the display substrates provided in FIGS. 1 to 3 is diffracted, there are weak diffraction defects with the same intensity along the second direction.

Figure 5:
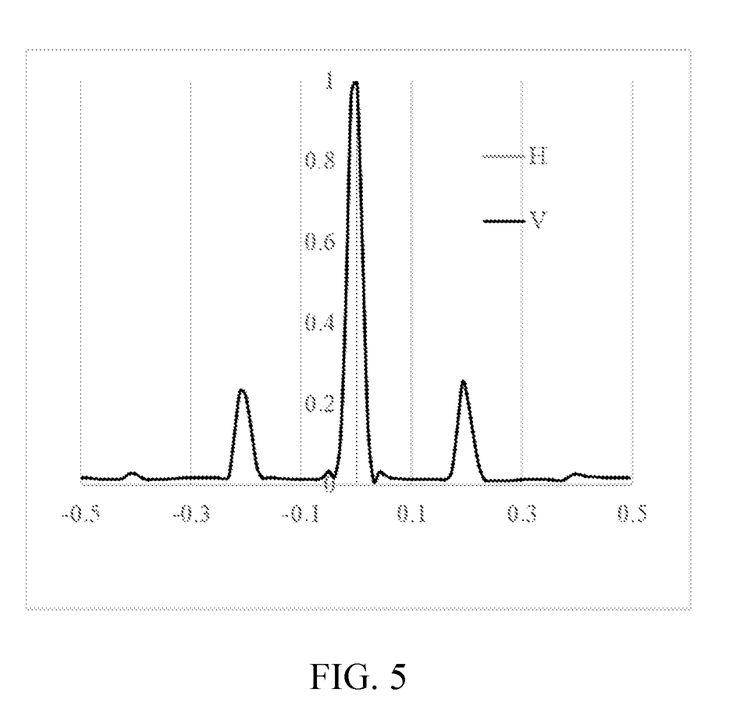
FIG. 5 is a diffraction spectrum corresponding to the display substrate provided in FIG. 1.
Figure 6:
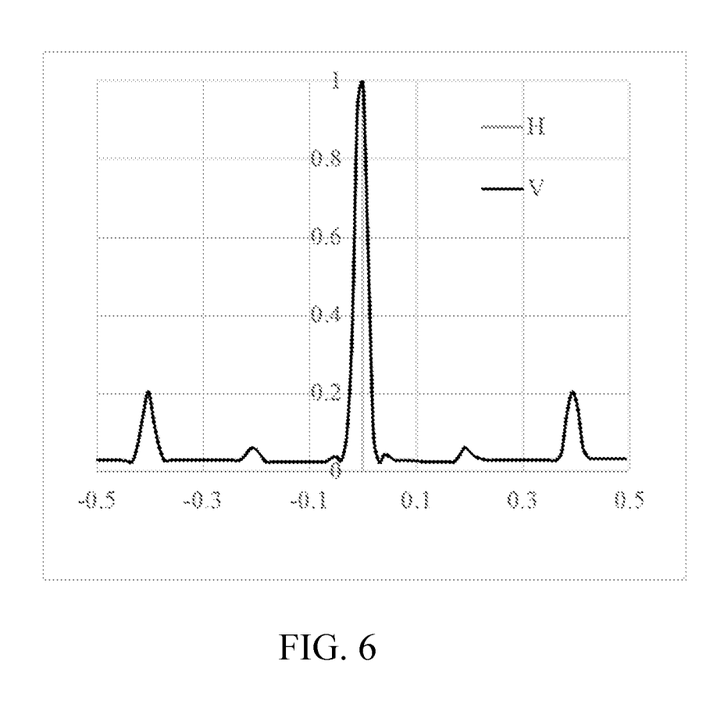
FIG. 6 is a diffraction spectrum corresponding to the display substrate provided in FIG. 2.
Figure 7:
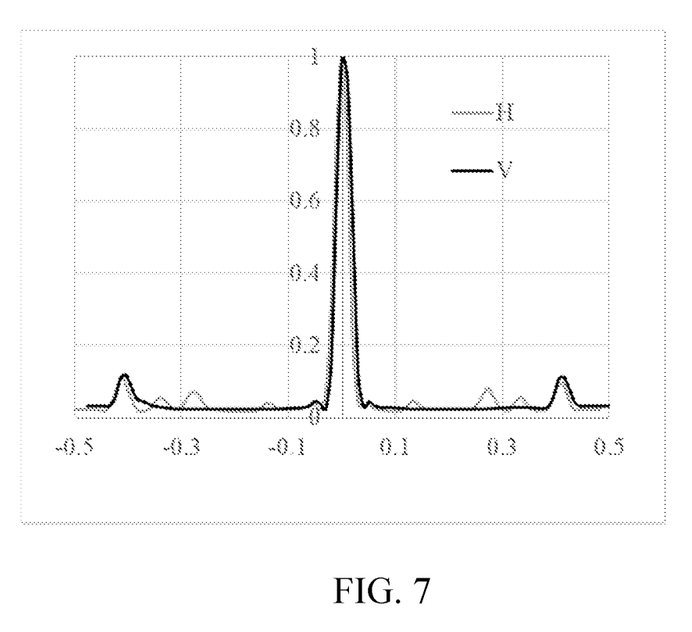
FIG. 7 is a diffraction spectrum corresponding to the display substrate provided in FIG. 3.

FIG. 5 is a diffraction spectrum corresponding to the display substrate provided in FIG. 1; FIG. 6 is a diffraction spectrum corresponding to the display substrate provided in FIG. 2; and FIG. 7 is a diffraction spectrum corresponding to the display substrate provided in FIG. 3. As shown in FIGS. 5 to 7, a horizontal coordinate refers to a ratio of the wavelength of light to a distance between an image and the display substrate, a vertical coordinate refers to a ratio of light intensity to the maximum light intensity, H refers to the horizontal direction and V refers to the vertical direction. As the transparent region in each sub-pixel region in FIGS. 5 and 6 is identical, and the transparent region is of a central symmetric structure, the diffraction spectra along the horizontal direction and the vertical direction in FIGS. 5 and 6 completely overlap. As the transparent regions in the sub-pixel regions in different columns in FIG. 7 are different, the diffraction spectra in the horizontal direction and the vertical direction in FIG. 7 do not completely overlap. When diffraction occurs in the display substrates provided in FIGS. 5 to 7, heights of the secondary diffraction peaks along the horizontal direction decrease sequentially from above 20% to below 15%, so as to reduce effectively the diffraction intensity of light in a single area in the horizontal direction, thereby greatly improving the clarity of the display image and improving the display effect.

An embodiment of the present disclosure further provides a display device including a display substrate.

In an exemplary embodiment, the display device may be any device that displays an image regardless of whether the image is motive (for example, a video) or stationary (for example, a still image), whether the image is a text or a picture. More specifically, the embodiments are supposed to be implemented in or associated with various electronic devices such as (but not limited to) a mobile phone, a wireless device, a personal digital assistant (PDA), a handheld or portable computer, a GPS receiver/navigator, a camera, an MP4 video player, a video camera, a game console, a watch, a clock, a calculator, a TV monitor, a tablet display, a computer monitor, a car display (e.g., an odometer display), an avigraph, a cockpit controller and/or display, a display for camera view (e.g., a display of a rearview camera in a car), an electronic photo, an electronic billboard or sign, a projector, a building structure, a package structure, and an aesthetic structure (e.g., a display for an image of a piece of jewelry).

The display substrate is the display substrate in accordance with any one of the preceding embodiments, and the implementation principle and implementation effect are similar and will not be repeated herein.

The accompanying drawings of the present disclosure relate only to the structures involved in the embodiments of the present disclosure, and the other structures may refer to conventional designs.

For the sake of clarity, the thickness and size of a layer or a micro structure is enlarged in the accompanying drawings used to describe the embodiments of the present disclosure. It can be understood that when an element such as a layer, film, region or substrate is described as being "on" or "under" another element, the element can be "directly" located "on" or "under" the other element, or an intermediate element may exist.

Although the embodiments disclosed in the present disclosure are described as above, the described contents are only embodiments used for facilitating understanding of the present disclosure, but not intended to limit the present disclosure. Any skilled person in the art to which the present disclosure pertains can make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising: a base and a plurality of sub-pixel regions arranged in a matrix on the base, each of the sub-pixel regions comprising a display region and a transparent region; and
   the transparent region of each of the sub-pixel regions comprising at least one arc boundary;
   wherein each sub-pixel region is of an axisymmetric structure, and symmetry axes of each sub-pixel region comprise a first symmetry axis and a second symmetry axis;
   a first direction is an extension direction of the first symmetry axis, and a second direction is an extension direction of the second symmetry axis; the first direction is perpendicular to the second direction; and a plane formed by the first direction and the second direction is parallel to a plane where the display substrate is located;
   each sub-pixel region is evenly divided into a first region, a second region, a third region and a fourth region; and
   the first region and the second region are arranged along the first direction; the third region and the fourth region are arranged along the second direction; the first region and the third region are arranged along the second direction; and the second region and the fourth region are arranged along the second direction.

2. The display substrate according to claim 1, wherein the plurality of sub-pixel regions comprises a first type of sub-pixel regions or a second type of sub-pixel regions;
   a boundary of the transparent region of a sub-pixel region of the first type is in a shape of a circle; and
   the transparent region of a sub-pixel region of the second type comprises a first transparent region, a second transparent region, a third transparent region and a fourth transparent region which are spaced apart from each other; and boundaries of the first transparent region, the second transparent region, the third transparent region and the fourth transparent region are in a shape of a right-angle sector.

3. The display substrate according to claim 1, wherein the plurality of sub-pixel regions comprises a first type of sub-pixel regions and a second type of sub-pixel regions;
   a boundary of the transparent region of a sub-pixel region of the first type is in a shape of a circle; and the transparent region of a sub-pixel region of the second type comprises a first transparent region, a second transparent region, a third transparent region and a fourth transparent region which are spaced apart from each other; and boundaries of the first transparent region, the second transparent region, the third transparent region and the fourth transparent region are in a shape of a right-angle sector.

4. The display substrate according to claim 2, wherein for at least part of transparent regions, a first interval, which is an interval between a transparent region and a first adjacent transparent region along the first direction, is equal to a second interval, which is an interval between the transparent region and a second adjacent transparent region along the second direction, wherein the first adjacent transparent region and the transparent region are arranged along the first direction, and the second adjacent transparent region and the transparent region are arranged along the second direction.

5. The display substrate according to claim 2, wherein a center of the transparent region in the sub-pixel region of the first type coincides with a center of the sub-pixel region of the first type, and the center of the sub-pixel region of the first type is an intersection point of the first symmetry axis and the second symmetry axis.

6. The display substrate according to claim 5, wherein a diameter of the transparent region in the sub-pixel region of the first type is smaller than a length of the sub-pixel region of the first type along the first direction and smaller than a length of the sub-pixel region of the first type along the second direction; and
the display region in the sub-pixel region of the first type surrounds the transparent region in the sub-pixel region of the first type.

7. The display substrate according to claim 2, wherein for the sub-pixel region of the second type, the first transparent region is located in the first region, the second transparent region is located in the second region, the third transparent region is located in the third region, and the fourth transparent region is located in the fourth region; and
the first transparent region and the second transparent region are mirror symmetric with respect to the second symmetry axis, the third transparent region and the fourth transparent region are mirror symmetric with respect to the second symmetry axis, the first transparent region and the third transparent region are mirror symmetric with respect to the first symmetry axis, and the second transparent region and the fourth transparent region are mirror symmetric with respect to the first symmetry axis.

8. The display substrate according to claim 7, wherein the right-angle sector comprises an arc; and
the arc is tangent to a boundary of the sub-pixel region of the second type.

9. The display substrate according to claim 8, wherein the right-angle sector comprises a third symmetry axis; and
the third symmetry axis intersects with the first symmetry axis and the second symmetry axis respectively.

10. The display substrate according to claim 3, wherein when the plurality of sub-pixel regions comprises the first type of sub-pixel regions and the second type of sub-pixel regions, the types of the sub-pixel regions in a same column are the same, but the types of the sub-pixel regions in a same row are different; and
for the sub-pixel regions in the same row, two sub-pixel regions of the second type are arranged between adjacent sub-pixel regions of the first type; and one sub-pixel region of the first type is arranged between adjacent sub-pixel regions of the second type.

11. The display substrate according to claim 1, wherein the display region comprises a driving structure layer and a light emitting structure layer which are sequentially disposed on the base; and
the driving structure layer is connected to the light emitting structure layer and is configured to drive the light emitting structure layer to emit light.

12. The display substrate according to claim 11, wherein the light emitting structure layer comprises a first electrode, an organic light emitting layer and a second electrode;
the first electrode is arranged on one side of the organic light emitting layer close to the base, and the second electrode is arranged on one side of the organic light emitting layer away from the base;
the first electrode is a reflective electrode, and the second electrode is a transmissive electrode and is a planar electrode; and
an orthographic projection of the second electrode on the base coincides with an orthographic projection of the transparent region on the base.

13. A display device comprising the display substrate according to claim 1.

14. The display substrate according to claim 3, wherein for at least part of transparent regions, a first interval, which is an interval between a transparent region and a first adjacent transparent region along the first direction, is equal to a second interval, which is an interval between the transparent region and a second adjacent transparent region along the second direction, wherein the first adjacent transparent region and the transparent region are arranged along the first direction, and the second adjacent transparent region and the transparent region are arranged along the second direction.

15. The display substrate according to claim 3, wherein a center of the transparent region in the sub-pixel region of the first type coincides with a center of the sub-pixel region of the first type, and the center of the sub-pixel region of the first type is an intersection point of the first symmetry axis and the second symmetry axis.

16. The display substrate according to claim 15, wherein a diameter of the transparent region in the sub-pixel region of the first type is smaller than a length of the sub-pixel region of the first type along the first direction and smaller than a length of the sub-pixel region of the first type along the second direction; and
the display region in the sub-pixel region of the first type surrounds the transparent region in the sub-pixel region of the first type.

17. The display substrate according to claim 3, wherein for the sub-pixel region of the second type, the first transparent region is located in the first region, the second transparent region is located in the second region, the third transparent region is located in the third region, and the fourth transparent region is located in the fourth region; and
the first transparent region and the second transparent region are mirror symmetric with respect to the second symmetry axis, the third transparent region and the fourth transparent region are mirror symmetric with respect to the second symmetry axis, the first transparent region and the third transparent region are mirror symmetric with respect to the first symmetry axis, and the second transparent region and the fourth transparent region are mirror symmetric with respect to the first symmetry axis.

18. The display substrate according to claim 17, wherein the right-angle sector comprises an arc; and
   the arc is tangent to a boundary of the sub-pixel region of the second type.

19. The display substrate according to claim 18, wherein the right-angle sector comprises a third symmetry axis; and
   the third symmetry axis intersects with the first symmetry axis and the second symmetry axis respectively.

* * * * *